(12) United States Patent
Chen et al.

(10) Patent No.: US 12,373,628 B1
(45) Date of Patent: *Jul. 29, 2025

(54) VIRTUAL ISOLATED PATTERN LAYER: ISOLATED PATTERN RECOGNITION, EXTRACTION AND COMPRESSION

(71) Applicant: Synopsys, Inc., Sunnyvale, CA (US)

(72) Inventors: Jun Chen, Cary, NC (US); James Lewis Nance, Raleigh, NC (US); Karthikeyan Muthalagu, Durham, NC (US); Nathaniel Garrett Brooks, Carrboro, NC (US)

(73) Assignee: SYNOPSYS, INC., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/649,893

(22) Filed: Apr. 29, 2024

Related U.S. Application Data

(63) Continuation of application No. 17/466,838, filed on Sep. 3, 2021, now Pat. No. 12,019,966.

(60) Provisional application No. 63/074,186, filed on Sep. 3, 2020.

(51) Int. Cl.
  *G06F 30/392* (2020.01)
  *G06F 30/398* (2020.01)

(52) U.S. Cl.
  CPC .......... *G06F 30/392* (2020.01); *G06F 30/398* (2020.01)

(58) Field of Classification Search
  USPC ...................... 716/110, 111, 112, 51, 52, 55
  See application file for complete search history.

(56) References Cited

U.S. PATENT DOCUMENTS

| | | | |
|---|---|---|---|
| 7,795,099 B2 | 9/2010 | Kang | |
| 2020/0127026 A1* | 4/2020 | Ukigaya | ................ H04N 25/75 |

FOREIGN PATENT DOCUMENTS

| | | |
|---|---|---|
| JP | 2006018954 A | 1/2006 |
| KR | 950005439 B1 | 5/1995 |

\* cited by examiner

*Primary Examiner* — Brian Ngo
(74) *Attorney, Agent, or Firm* — Womble Bond Dickinson (US) LLP (57) ABSTRACT

A method includes identifying isolated shapes within a semiconductor design. The isolated shapes correspond to patterns of layers of components of the semiconductor design. The method also includes identifying one or more unique patterns among the isolated shapes, generating a virtual isolated pattern layer including data associated with the isolated shapes and the one or more unique patterns, determining whether a unique pattern of the one or more unique patterns satisfies a design rule based on the data of the virtual isolated pattern layer and producing an updated semiconductor design based on the determination that the unique pattern satisfies the design rule.

20 Claims, 8 Drawing Sheets

VIRTUAL ISOLATED PATTERN LAYER: ISOLATED PATTERN RECOGNITION, EXTRACTION AND COMPRESSION

CROSS-REFERENCE TO RELATED APPLICATIONS

The present application is a continuation application of U.S. patent application Ser. No. 17/466,838, filed Sep. 3, 2021, which claims the benefit under 35 U.S.C. § 119 (e) of U.S. Provisional Patent Application No. 63/074,186 filed on Sep. 3, 2020, the entire contents of each of which is incorporated herein by reference.

TECHNICAL FIELD

The present disclosure relates to isolated pattern recognition, extraction, and compression.

BACKGROUND

Physical verification process for an integrated circuit (IC) is a design step that is required by semiconductor manufacturers before commencing the fabrication of an IC chip. Each semiconductor foundry defines a set of design rules for manufacturing (DRM) that IC chip designers follow to ensure successful manufacture and high yield of a design during the fabrication process. The DRM defines a set of geometric relationships between the manufacturing layers that are used to ensure successful realization of the design on a silicon wafer. A design rule checking (DRC) physical verification tool is the industry standard process to enforce the DRM for a design layout. A modern physical design layout uses hundreds of design layers to realize billions of transistors and electrical connections that are verified through the use of a DRC tool.

The DRM defines width, spacing, angle, enclosure, density and electrical connectivity rules for design layers, which are translated into a DRC runset. The runset includes many individual DRC commands that implement the DRM rules. The DRC commands can vary from a simple spacing check or Boolean operation between two layers, to complex operations such as checking layer density and connectivity. A typical runset used to verify a modern physical design can have thousands of commands. A DRC physical verification tool includes a large suite of geometric and electrical commands to effectively implement the complex DRM rules. DRC is a part of the design flow that will be run iteratively several times prior to the completion of the design.

The DRC process is a CPU and memory intensive process due to the massive number of interactions between layers in an IC design. Reduction in the minimum feature size for IC designs has enabled designers to push more transistors (devices) in a small silicon wafer.

SUMMARY

In one aspect, a method includes identifying isolated shapes within a semiconductor design. The isolated shapes correspond to patterns of layers of components of the semiconductor design. The method also includes identifying one or more unique patterns among the isolated shapes, generating a virtual isolated pattern layer including data associated with the isolated shapes and the one or more unique patterns, determining whether a unique pattern of the one or more unique patterns satisfies a design rule based on the data of the virtual isolated pattern layer and producing an updated semiconductor design based on the determination that the unique pattern satisfies the design rule.

In one aspect, a system includes a memory storing instructions, and a processor, coupled with the memory and to execute the instructions. The instructions when executed cause the processor to identify isolated shapes within a semiconductor design, identify one or more unique patterns among the isolated shapes, generate a virtual isolated pattern layer including data associated with the isolated shapes and the one or more unique patterns, determine whether a unique pattern of the one or more unique patterns satisfies a design rule based on the data of the virtual isolated pattern layer, and produce a final design for fabrication based on the determination that the unique pattern satisfies the design rule. The isolated shapes correspond to patterns of layers of components of the semiconductor design.

BRIEF DESCRIPTION OF THE DRA WINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

The present disclosure relates to electronic design automation (EDA) and physical verification of semiconductor designs. The methods and systems described herein may be implemented inside a design rule checking (DRC) tool used by semiconductor foundries. Aspects of the present disclosure relate to a virtual isolated pattern layer: isolated pattern recognition, extraction, and compression. A virtual isolated pattern layer (VIPL) is built. The virtual isolated pattern layer includes data associated with isolated patterns. The VIPL may be used in performing an efficient DRC process for verification of a semiconductor design before the design proceeds to a fabrication stage. The isolated patterns are identified and data associated with the isolated patterns are extracted to the VIPL. In addition, the VIPL data may be compressed to minimize storage requirements.

Processing very large IC design layers presents several performance issues for hierarchical verification tools. Each hierarchical algorithm may have many optimizations to avoid flattening the algorithm's result (output layer). Without these algorithmic optimizations, hierarchical data flattening may cause extra processing time for the current algorithm and increase processing time for subsequent algorithms in the DRC rule. Described herein are approaches for the extraction and separation of data that have no hierarchical interactions from data that have hierarchical interaction to improve the operation of physical verification software. Embodiments of the approaches described herein improve both run time efficiency and the quality of the results of the physical verification tool.

Semiconductor designs use an abstraction called cells that are used to break down a complex design into smaller modules (e.g., a collection of cells). Large integrated circuit (IC) chips are built using a hierarchical method that begins by creating small cells. A cell may represent the lowest level of a cluster of components such as a transistor, a sub-circuit, or the like. Small cells (child cells) are combined into larger cells (parent cells) that are successively used to build larger and larger cells which results in a hierarchical design. In a hierarchy, an instance of a particular cell is called a placement of the cell. A cell can be placed multiple times in multiple cells, which makes the design hierarchy deep and complex.

A typical cell has polygon shapes that represent transistors and child cells placed inside the cell. In some embodiments, the shapes are stored in the design database. Hierarchy of a physical design can be considered as the skeleton of the design that may not include all the full layout view. Hierarchical information, polygon shapes and placement information are efficiently stored in a file referred to as the design database.

A DRC tool reads a design database and a runset (i.e., design rules) and executes those rules on the database. Hierarchical physical verification is a complex process due to multitude of hierarchical design styles that are created by IC design companies and other IC industry tools. These different design styles result in extremely complex designs that are multiple levels deep and contain billions of cells and polygons overlapping each other throughout the hierarchy. Typically, a hierarchical verification tool collapses inefficient cell hierarchies and merges duplicate polygons to build an optimal hierarchy for the tool's individual runset algorithms.

In one aspect, when an instance of a cell is placed in the hierarchy, it can interact with other data. This may be referred to as hierarchical interactions. There are generally two types of hierarchical interactions. When the bounding box of an instance of a cell overlaps or abuts its parent cell's cell level polygon data, this is referred to as a parent-child hierarchical interaction. When the bounding box of an instance of a cell overlaps or abuts the polygon data of another instance of a cell in the same parent, this may be referred to as a sibling to sibling interaction. The overlapping instances each may have its own hierarchy, so the hierarchical interactions might have several levels in depth.

The hierarchical data flattening usually happen on the data that have hierarchical interactions. However, when a huge amount of data that do not have hierarchical interactions mix together with the data that do have hierarchical interactions, the additional complexity and data volume cause significant increase in processing time for hierarchical algorithms. Designs may contain a large number of repeated or identical patterns (polygons) that do not have hierarchical interactions. Repeated patterns may refer to the same pattern repeated multiple times in the design. Two patterns are identical if all the shapes of the pattern are identical. The repeated or identical patterns do not overlap with any other shape in the design hierarchy. This is especially true for designs with fill data (e.g., layout location and parameters of metal (or oxide) fill rectangles) because the fill patterns may be repeated throughout the design but also common on designs without fill. For example, a library of cells (different size cells) may be used for placement of fill structures. A cell can be chosen from the library to fill a desired area.

It is CPU and memory intensive for hierarchical physical verification tool to perform DRC checks on the polygons that do have hierarchical interactions. The combination of these "isolated" polygons together with the "non-isolated" polygons make it more CPU and memory intensive.

An isolated polygon may be a polygon that does not have any hierarchical interactions with any other data in the design. As described above, when an instance of a cell is placed in another cell, the cells have parent to child relationship. When two cells are placed in the same parent cell, the cells have sibling relationship. A non-isolated polygon may be a polygon that have hierarchical interaction with other data in the design.

The runtime and memory usage to perform physical verification on a design with fill data usually is much longer than performing physical verification on a design without fill data as the billions of inserted fill data greatly increase the amount of work need to be done. In one aspect, the amount of the isolated polygons can be large. For example, it is common to see more than 1 billion such shapes in just one layer such as Metal2 in a design. The isolated polygons tend to repeat themselves in the design. Over the 1 billion shapes (isolated polygons), there may only be perhaps 10,000 unique patterns. In conventional methods, all of the data in a layer are loaded and DRC checks are performed on all of the data in the layer, even when majority of the data are identical and have no hierarchical interactions.

In some embodiments, "isolated" shapes in the design are identified and extracted. Then, unique patterns among the extracted isolated shapes may be identified. DRC check may be performed once for each unique pattern, rather than at each location (placement) where it is instantiated. The DRC command performance improves significantly. In one example, the runtime decreases by 2 to 50 times. It also reduces disk usage by 30% to 50%.

In some embodiments, data associated with the isolated shapes may be stored in a virtual isolated pattern layer (VIPL). VIPL data for a cell represents data in the cell that does not have any hierarchical interactions either from parent or from siblings, for any instances of the cell in the hierarchy. VIPL data is represented as an extension of a derived virtual layer or VIPL. The VIPL is generated and includes the VIPL data.

Described herein is a method to generate the VIPL data. Also, described herein is a method for the identification of repeated patterns in the VIPL data and for the compression of the VIPL data. In one aspect, the process is repeated for any sequence of DRC checks in the runset. VIPL data may be generated for one or more sequences of DRC checks in the runset.

FIG. 1 to FIG. 6 illustrate the concept of the VIPL for a particular example. A hierarchical view or layout may include multiple instantiation of different cells. The hierarchical view may be used to extract isolated shapes. In one example, the hierarchical view may include Cell A, Cell B, and Cell C, shown in FIG. 1, FIG. 2, and FIG. 3, respectively. Hierarchical interactions may be determined using the hierarchical view. Then, the isolated shapes are extracted based on the hierarchical interactions.

Figure 1:
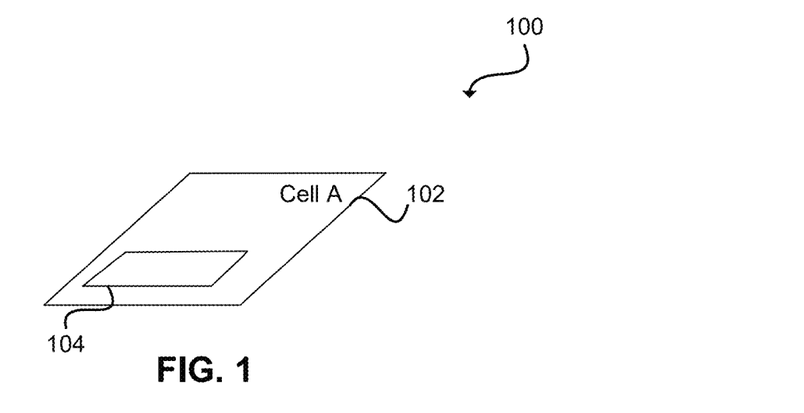
FIG. 1 shows example Cell A cell-level data, in accordance with an embodiment of the present disclosure.

FIG. 1 shows example Cell A 100 cell-level data, in accordance with an embodiment of the present disclosure. Cell A can represent a layout of various types of cells that can appear in the design. For example, Cell A can be a combinational logic cell such as an AND gate, a NAND gate, an OR gate, a NOR gate, an XOR gate, an XNOR gate, a NOT gate, and the like. Cell A can be a sequential logic cell such as a latch, a register cell, a flip-flop, and the like. Cell A can be a complex cell that is formed from one or more simple cells. Cell A 100 can be included in a design database and can be instantiated any number of times in the design. Cell A 100 has a cell boundary 102. The cell boundary 102 may delineate Cell A from other cells. The cell boundary 102 may include shapes (geometric shapes) on more layers that represent Cell A. The shapes may include rectangles, polygons, trapezoids, and the like that form wires, active devices, and the like. For example, cell boundary 102 includes a single polygon shape 104.

Figure 2:
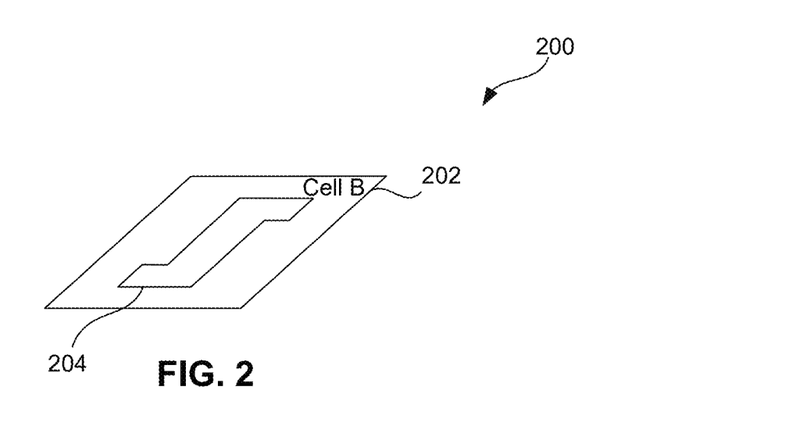
FIG. 2 shows example Cell B cell-level data, in accordance with an embodiment of the present disclosure.

FIG. 2 shows example Cell B 200 cell-level data, in accordance with an embodiment of the present disclosure. Similar to Cell A, Cell B may represent a layout of various cells including combinational cells, sequential cells, or the like. Cell B 200 can be included in a design database and can be instantiated any number of times in the design. Cell B 200 has a cell boundary 202 and includes a single polygon shape 204.

Figure 3:
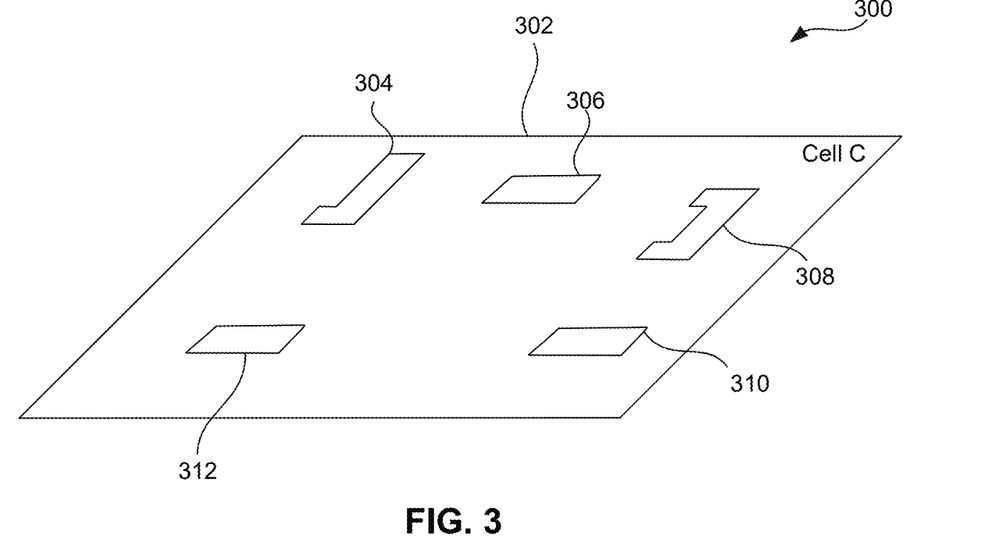
FIG. 3 shows example Cell C cell-level data, in accordance with an embodiment of the present disclosure.

FIG. 3 shows example Cell C 300 cell-level data, in accordance with an embodiment of the present disclosure. Cell C 300 has a cell boundary 302 and five directly instantiated polygon shapes on a layer being analyzed, a first polygon shape 304, a second polygon shape 306, a third polygon shape 308, a fourth polygon shape 310, and a fifth polygon shape 312.

Figure 4:
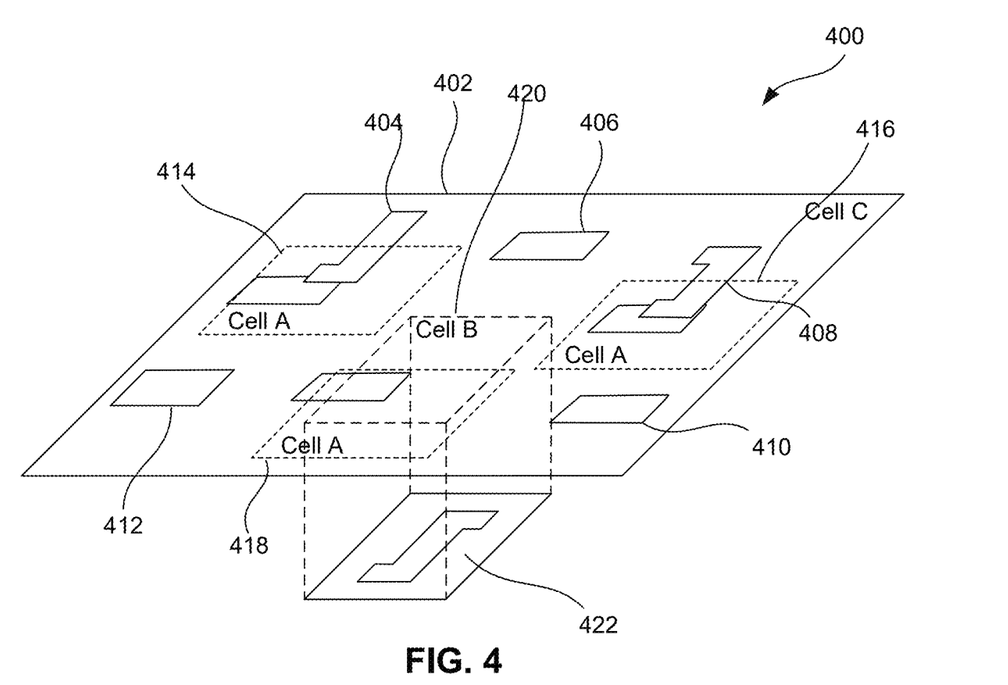
FIG. 4 shows an example hierarchical view: Cell A and Cell B as child cells of Cell C, in accordance with an embodiment of the present disclosure.

FIG. 4 shows an example hierarchical view: Cell A and Cell B as child cells of Cell C, in accordance with an embodiment of the present disclosure. Cell C 400 has a cell boundary 402 and five directly instantiated polygon shapes on the layer being analyzed, a first polygon shape 404, a second polygon shape 406, a third polygon shape 408, a fourth polygon shape 410, and a fifth polygon shape 412. Cell C 400 includes hierarchy in its design as it also includes three instantiations of Cell A, the first instantiation of Cell A 414, the second instantiation of Cell A 416, and the third instantiation of Cell A 418. Cell C 400 also includes an instantiation of Cell B 420. The detail of the shapes for the instantiation of Cell B 420 is shown in a detail view 422. The details of the first instantiation of Cell A 414, the second instantiation of Cell A 416, and the third instantiation of Cell A 418 are left out for clarity.

In the example shown in FIG. 4, Cell C 400 is a parent to the first instantiation of Cell A 414, the second instantiation of Cell A 416, the third instantiation of Cell A 418, and the instantiation of Cell B 420. Also, the first instantiation of Cell A 414, the second instantiation of Cell A 416, the third instantiation of Cell A 418, and the instantiation of Cell B 420 are all sibling cells to each other.

Figure 5:
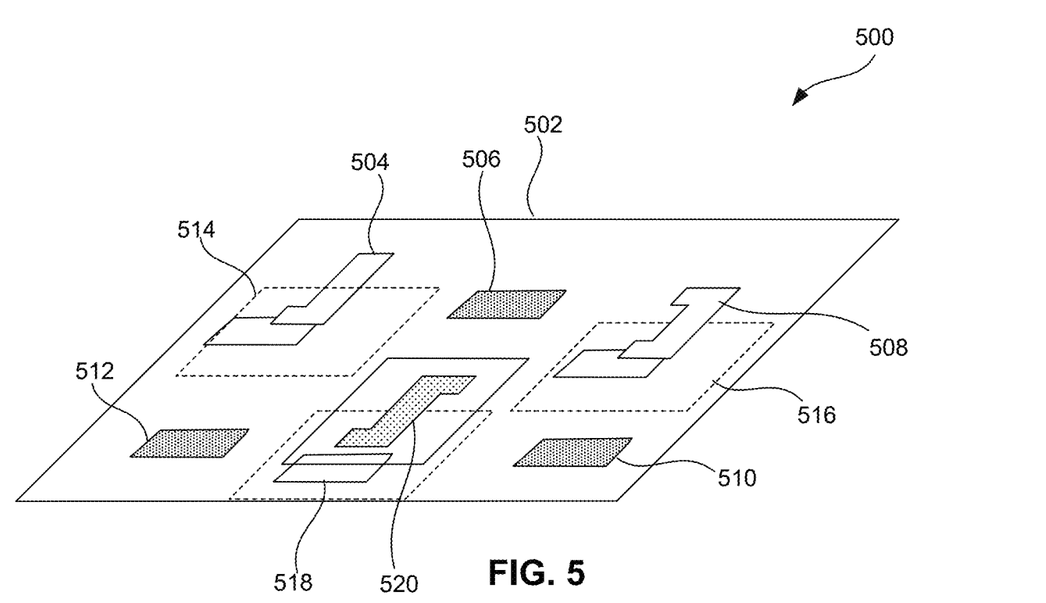
FIG. 5 shows an example of isolated polygon in patterns, in accordance with an embodiment of the present disclosure.

FIG. 5 shows an example of hierarchical interactions for instances of Cell A and Cell B. An instantiation of Cell C 500, similar to that shown in FIG. 4, includes a cell boundary 502, five directly instantiated polygonal shapes 504, 506, 508, 510, and 512, and three instantiations of Cell A 514, 516, and 518, as well as an instantiation of Cell B 520. The polygonal shape 504 interacts with the first instantiation of Cell A 514. Polygonal shape 508 interacts with the second instantiation of Cell A 516. The third instantiation of Cell 518, the instantiation of Cell B 520, and polygonal shapes 506, 510, and 512 do not interact with any other shapes.

In some embodiments, an algorithm is used to find all the isolated polygons in the design. The algorithm finds all the isolated polygons in the design. In one example, the algorithm may run from any cell in the design. One or more cells may be checked simultaneously. In one example, data in each cell is cycled down to all the children and siblings of the cell for all the cells in the design. This can be down by moving through the hierarchy or translation of the hierarchy to obtain the information about the cell and to determine whether the cell interacts with another cell. If the data touches any data in the process, both data are marked as interacting. For example, if a shape is in a parent cell (i.e., shape in the parent cell coordinate), then the algorithm may look at the child cell coordinate to determine whether the shape interacts with any shape in the child cell. This process continues until the leaf cell of the design is reached. Any unmarked data at the end of the process are considered isolated. In some embodiments, a traversal of the hierarchy may be done in parallel.

In some embodiments, the isolated polygons are removed from the original layer and stored in the virtual isolated pattern layer. In FIG. 5, the third instantiation of cell A 518, the instantiation of cell B 520, and the polygonal shapes 506, 510, and 512 are isolated polygons. Thus, data associated with the third instantiation of cell A 518, the instantiation of cell B 520, and the polygonal shapes 506, 510, and 512 may be stored in the virtual isolated pattern layer.

Figure 6:
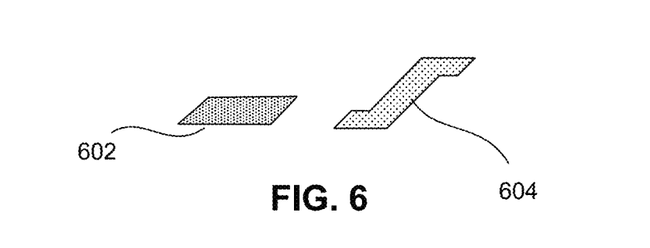
FIG. 6 shows an example of identified unique patterns, in accordance with an embodiment of the present disclosure.

In some embodiments, a large number of the identified isolated polygons may be identical polygons. FIG. 6 shows an example of unique patterns that corresponds to the isolated polygons identified in FIG. 5. The unique patterns includes a first pattern 602 and a second pattern 604. The first pattern 602 corresponds to polygonal shapes 506, 510, 512 and the third instantiation of cell A 518. The second pattern 604 corresponds to the instantiation of cell B 520.

In some embodiments, the unique patterns and the location of these patterns are tracked when the isolated polygons are generated. For example, the VIPL includes the geometric information for the unique patterns and data indicating where the unique patterns are instantiated in the design (i.e., location, placement). This information is used to speed up the DRC checks on the layer.

Figure 8A:
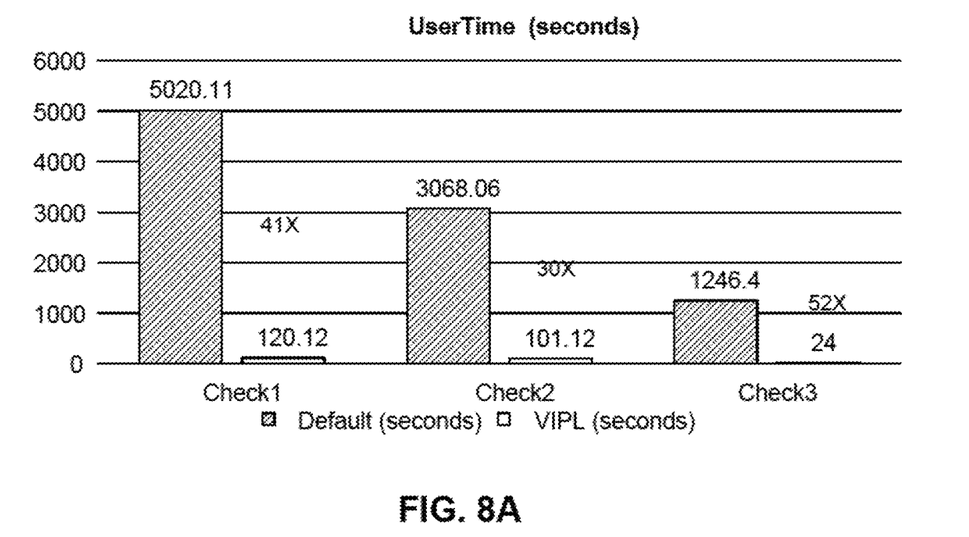
FIGS. 8A and 8B illustrate exemplary results for a design, in accordance with an embodiment of the present disclosure.
Figure 8B:
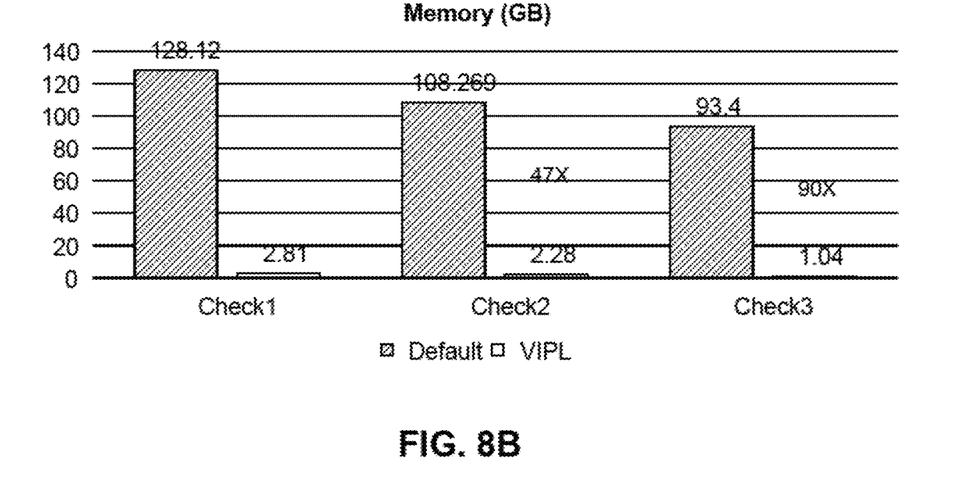

In some embodiments, DRC check is performed once for each unique pattern after the VIPL data are generated and compressed, rather than at each location (placement) where it is instantiated. This may be applied when the result of the operation or DRC check is within the boundary of the identified unique pattern. An IC design may include a plurality of metal layers. For example, the IC design may include two layers of metals referred to as metal1 and metal2 layers. In an exemplary IC design, a metal2 layer may have 10 billion polygons. The 10 billion polygons can be compressed down to several tens of thousands of unique patterns. Thereafter, instead of running a DRC check on the 10 billion polygons, the DRC check is run on only the several tens of thousands of unique patterns. This offers a significant performance boost as shown in FIGS. 8A and 8B.

In some embodiments, some DRC checks cannot operate on the VIPL data. The output of the DRC checks cannot grow outside of the original pattern to be applicable for VIPL. In some embodiments, DRC checks that operate inside the polygon boundaries can be run. Otherwise, the output can create new hierarchical interactions and cause the results to become invalid. There are a significant amount of DRC checks that can be performed using the VIPL data. For example, internal spacing checks, width checks, vertex checks and self-connect are all VIPL applicable commands or operations.

In some embodiments, a subsequent command can use the VIPL data from a previous command. For example, the VIPL data can be generated once. The VIPL data can flow through a chain of VIPL applicable commands. This offers maximum benefits from using a VIPL because the VIPL data is not regenerated for each command. All the commands in the chain are VIPL applicable checks and the VIPL data stay valid for the entire chain.

A chain of commands may include a first command "area" that selects polygons whose area fits the specified value, a second command "length_edge" command to compute and select edges based on the length, a third command that return polygons that do not have any inside or outside edge coincidence with the edges of another layer, and a fourth command that returns polygons that are not large enough to enclose a specified rectangle. An exemplary chain of commands is shown below:

A=area (M6, <M6_A_3);
B=length_edge (A, >=M6_A_3_L);
C=A not_touching B;
not_contains (C, {M6_A_3_W1, M6_A_3_W2}).

In one aspect, the longer the command chains is, a higher performance gain is achieved because the VIPL data are not regenerated for each command. Thus, the performance gain is higher when the runset includes a higher number of commands. The performance gain may be measured by comparing the memory usage and runtime of the command chains when a VIPL is generated and used as described herein and when a VIPL is not generated.

In some embodiments, a compression technique (e.g., delta compression) may be used to encode the placement information to minimize data storage. For example, once the placement information that includes location data of the duplicate isolated polygons or patterns are generated, a compression algorithm may be applied. Thus, the resources used to store the placement information is reduced.

Figure 7:
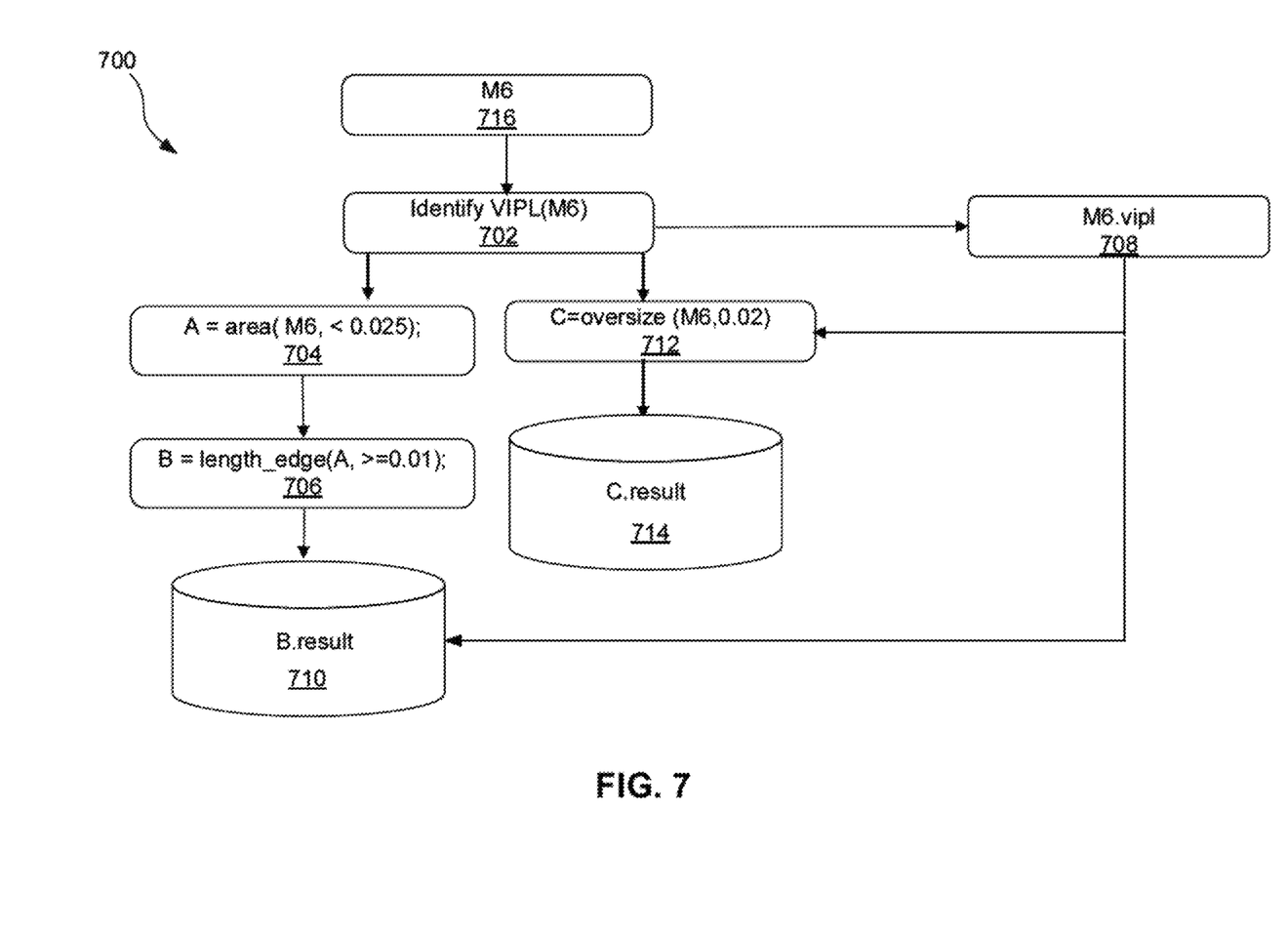
FIG. 7 illustrates an exemplary chain of commands, in accordance with an embodiment of the present disclosure.

FIG. 7 illustrates an exemplary chain of commands 700, in accordance with an embodiment of the present disclosure. At 702, VIPL data 708 may be generated from input data 716. The generation of the VIPL data 708 includes identifying the isolated polygons or patterns and encoding the location of duplicate isolated polygons or patterns. The VIPL data includes encoded location of duplicate isolated polygons that are removed (identified) from input data 716. Commands 704 and 712 are applied to the VIPL data. The result of command 704 stay within the boundary of the isolated shape. Thus, the results can be fed to another command. For example, the result of command 704 may be fed to command 706 without the need to regenerate the VIPL data. Commands 704 and 706 are executed and the result of the chain is combined with the VIPL data to produce the result, at 710.

Command 712 cannot take advantage of isolated polygons, and it therefore uses VIPL data to reconstruct the original 716 layer on demand, producing the result 714. In one aspect, the VIPL data 708 does not change as a command or a set of commands for a rule are processed. The generated VIPL data may be used in the command chain as long as the VIPL data remains valid.

In one embodiment, DRC commands which take as input two or more layers can also use VIPL data when all the input layers share the same VIPL data. For example, clearance commands that check the clearance from one layer to another. This includes situations where VIPL data flows through chains of VIPL applicable commands.

FIGS. 8A and 8B show exemplary results for a plurality of designs. For example, FIG. 8A shows the reduction in the user time for various functions. "Default" in FIGS. 8A and 8B represent the user time and memory usage when a VIPL is not generated. "VIPL" represent the user time and memory usage of running a runset for a design when the VIPL layer is generated as described previously herein. A reduction in time by 30 to 52 times is obtained in one example. In addition, a reduction in memory usage is obtained. In one example, the memory usage is reduced from 128.12 GB to 2.81 GB.

Figure 9:
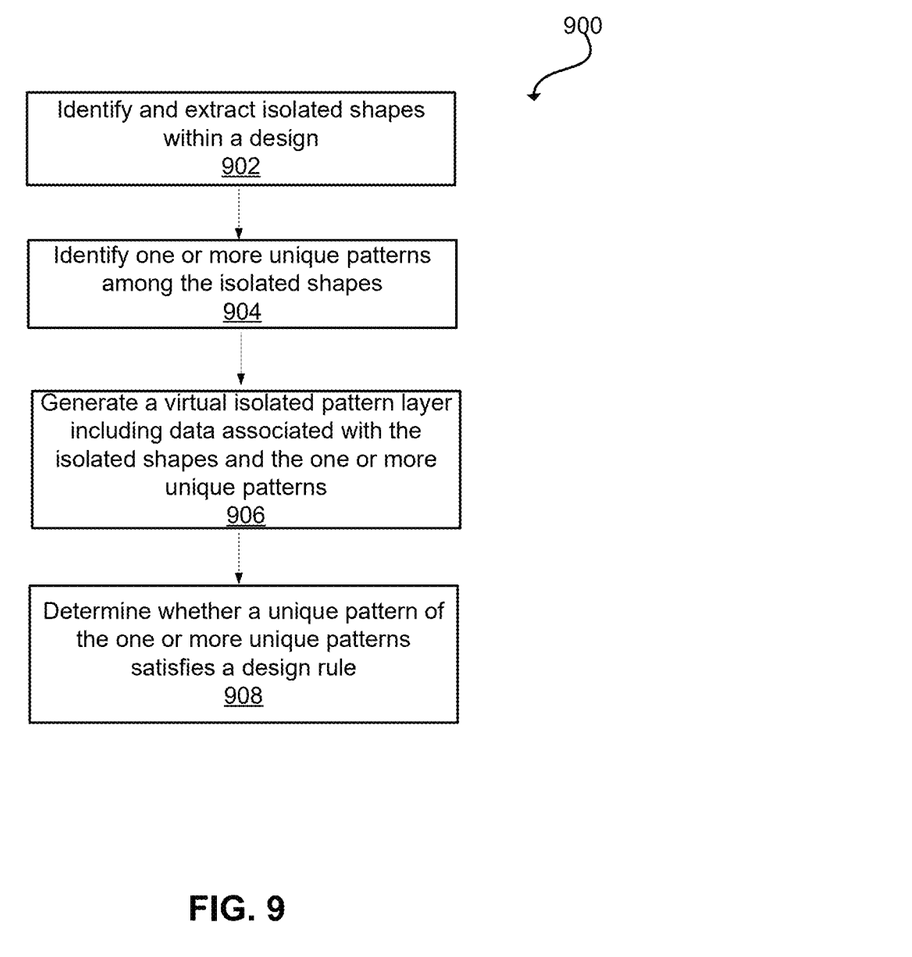
FIG. 9 depicts a flowchart of a method for isolated pattern recognition, extraction, and compression, in accordance with an embodiment of the present disclosure.

FIG. 9 depicts a flowchart 900 of a method for isolated pattern recognition, extraction, compression, and handling of the isolated patterns in accordance with an embodiment of the present disclosure. The method also includes merging the data with other data associated with the design.

In 902, isolated shapes within a design are identified. The design includes a plurality of hierarchical design levels and a plurality of cells. In some embodiments, the isolated shapes are extracted from an original layer. Design data associated with the isolated shapes are taken from the semiconductor design. The design data may be used to identify unique patterns in 904. Interactions between the cell and other structures in the plurality of hierarchical design levels are identified for each cell instance of the hierarchical design. The isolated shapes are identified as the remaining shapes that are not included in the design interactions. For example, the third instantiation of cell 518, the instantiation of cell B 520, and the polygonal shapes 506, 510, and 512 may be identified as isolated shapes in step 902.

In 904, one or more unique patterns among the isolated shapes are identified. In some embodiments, the unique patterns are identified by comparing design data of the identified isolated shapes. In some embodiments, coordinates of a first isolated shape are translated to the coordinates of a second isolated shape to determine whether the first isolated shape and the second isolated shape are identical. The translated coordinates of the isolated shapes may be compared with each other. Two patterns are identical if all the shapes of the pattern are identical. In some embodiments, location information for the unique pattern are stored. In addition, location information associated with instantiations of the unique pattern are stored. For example, the first pattern 602 and the second pattern 604 of FIG. 6 may be identified as unique patterns in step 904.

In 906, a virtual isolated pattern layer including data associated with the isolated shapes and the one or more unique patterns is generated. For example, the location of polygonal shapes 506, 510, 512, and the third instantiation of cell A (corresponding to the first pattern 602) may be stored.

In 908, a determination is made whether the unique pattern satisfies a design rule. For example, the design rule may check whether the pattern satisfies constraints imposed by the process technology to be used in manufacturing. In some embodiments, the DRC checks that operate within the boundary may be identified. For example, the DRC checks that operate within the boundary may include internal spacing checks, width checks, vertex checks and self-connect checks. In some aspects, a subset of design rules of the runset may be identified based on a type of the design rule (e.g., whether the rule operate within the boundary). The subset of design rules may be applied using the data of the virtual isolated pattern layer. The result of the check (determination) may be applied to another identical shape when the result is within a boundary of the unique pattern or when the design rule is included in the subset of the design rules. For example, if a unique pattern satisfies the internal spacing check, then the check is not repeated to pattern similar to the unique pattern. In some aspects, the pattern satisfies the spacing check if a minimum distance between objects is maintained. In some embodiments, the virtual isolated pattern layer may be regenerated when the output of the design rule is outside the boundary of the unique pattern.

In some embodiments, an updated semiconductor design is generated based on the determination. For example, the unique pattern may be modified and the runset may be reapplied to determine whether the unique pattern satisfies the design rule. In some embodiments, the updated semiconductor design is sent for fabrication. In some embodiments, the updated semiconductor design is a final design. The final design is sent for fabrication.

It should be understood that some of the above steps of the flow diagram of FIG. 9 can be executed or performed in an order or sequence other than the order shown and described in the figure. Further, some of the above steps may be performed well in advance of other steps, or may be executed or performed substantially simultaneously or in parallel.

Figure 10:
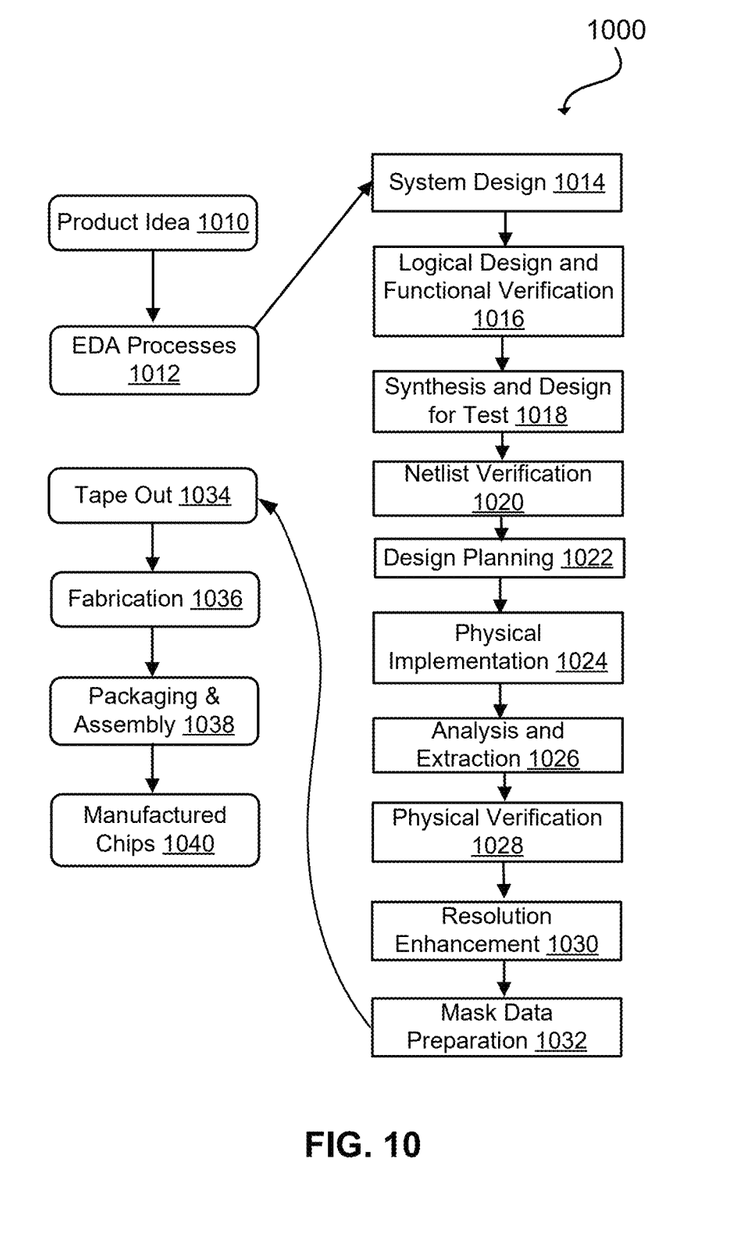
FIG. 10 depicts a flowchart of various processes used during the design and manufacture of an integrated circuit, in accordance with some embodiments of the present disclosure.

FIG. 10 illustrates an example set of processes 1000 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1010 with information supplied by a designer, information which is transformed to create an article of manufacture that uses a set of EDA processes 1012. When the design is finalized, the design is taped-out 1034, which is when artwork (e.g., geometric patterns) for the integrated circuit is sent to a fabrication facility to manufacture the mask set, which is then used to manufacture the integrated circuit. After tape-out, a semiconductor die is fabricated 1036 and packaging and assembly processes 1038 are performed to produce the finished integrated circuit 1040.

Specifications for a circuit or electronic structure may range from low-level transistor material layouts to high-level description languages. A high-level of abstraction may be used to design circuits and systems, using a hardware description language ('HDL') such as VHDL, Verilog, System Verilog, SystemC, MyHDL or Open Vera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 10. The processes described by be enabled by EDA products (or tools).

During system design 1014, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1016, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1018, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1020, the netlist is checked for compliance with timing constraints and for correspondence with the HDL code. During design planning 1022, an overall floor plan for the integrated circuit is constructed and analyzed for timing and top-level routing.

During layout or physical implementation 1024, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1026, the circuit function is verified at the layout level, which permits refinement of the layout design. During physical verification 1028, the layout design is checked to ensure that manufacturing constraints are correct, such as DRC constraints, electrical constraints, lithographic constraints, and that circuitry function matches the HDL design specification. During resolution enhancement 1030, the geometry of the layout is transformed to improve how the circuit design is manufactured.

During tape-out, data is created to be used (after lithographic enhancements are applied if appropriate) for production of lithography masks. During mask data preparation 1032, the 'tape-out' data is used to produce lithography masks that are used to produce finished integrated circuits.

A storage subsystem of a computer system (such as computer system 1100 of FIG. 11) may be used to store the programs and data structures that are used by some or all of the EDA products described herein, and products used for development of cells for the library and for physical and logical design that use the library.

Figure 11:
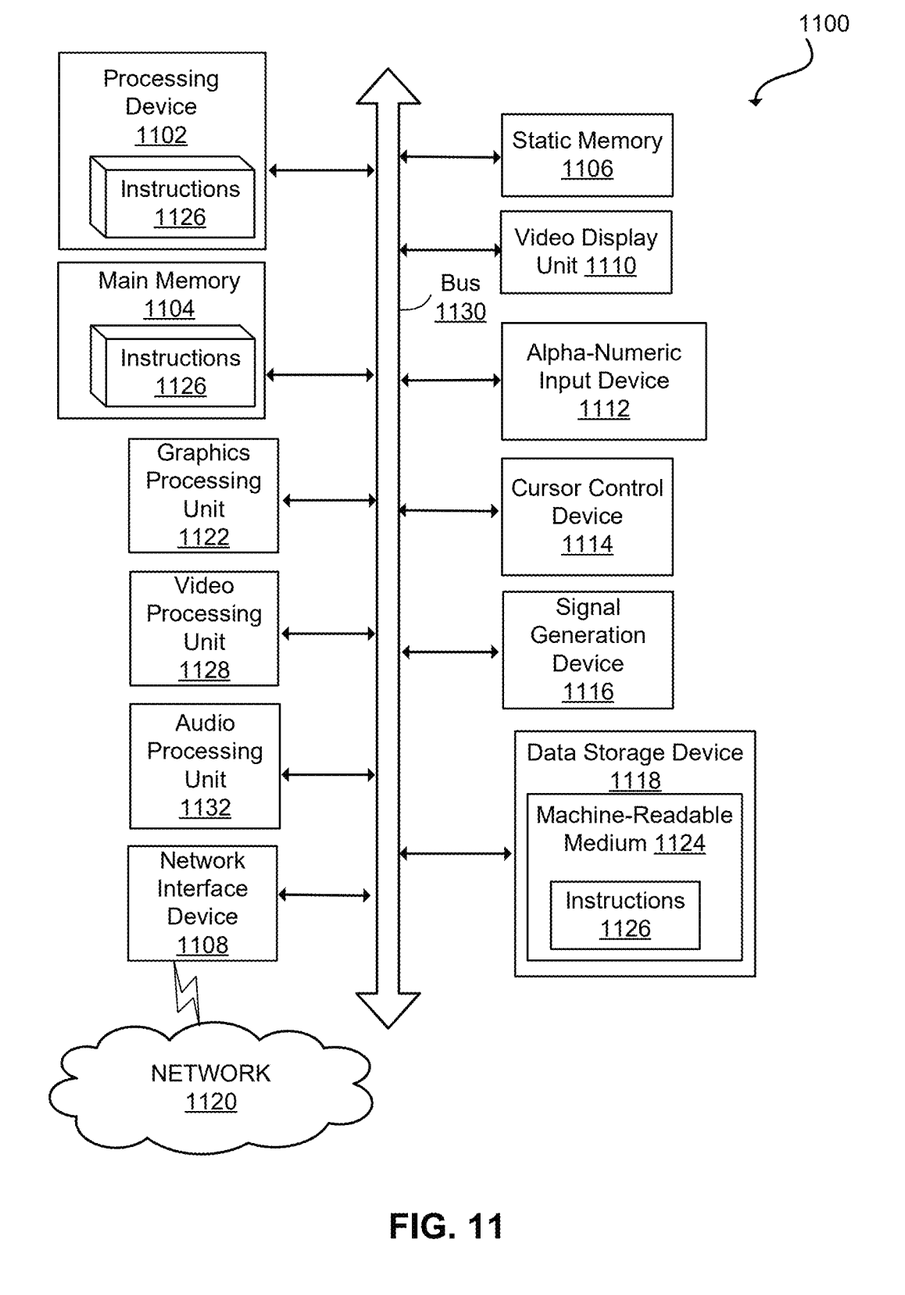
FIG. 11 depicts an abstract diagram of an example computer system in which embodiments of the present disclosure may operate.

FIG. 11 illustrates an example machine of a computer system 1100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
    identifying shapes within a semiconductor design, wherein the shapes correspond to patterns of layers of components of the semiconductor design;
    identifying one or more patterns among the shapes;
    generating, by a processing device, a virtual isolated pattern layer including data associated with the shapes and the one or more patterns;
    determining whether a pattern of the one or more patterns satisfies a design rule based on the data of the virtual isolated pattern layer; and
    verifying the semiconductor design based on whether the pattern of the one or more patterns satisfies the design rule.

2. The method of claim 1, wherein the semiconductor design includes a plurality of hierarchical design levels and a plurality of cells and wherein identifying the shapes comprises:
    identifying, for each cell instance of the semiconductor design, interactions between the cell and other structures in the plurality of hierarchical design levels; and
    identifying the shapes as remaining shapes that are not included in the interactions.

3. The method of claim 2, wherein the interactions include parent to child interactions and sibling interactions.

4. The method of claim 1, further comprising:
    storing location information for the pattern and location information associated with instantiations of the pattern.

5. The method of claim 4, further comprising:
    encoding the location information for the pattern and the location information associated with the instantiations of the pattern.

6. The method of claim 1, further comprising:
    feeding a result of a first design rule check to a second design rule check when the result of the first design rule check is within a boundary of the pattern.

7. The method of claim 1, wherein identifying the one or more patterns comprises:
    comparing translated coordinates of the shapes with each other.

8. The method of claim 1, further comprising:
    identifying a subset of design rules of a runset based on a type of the design rule; and applying the subset of design rules using the data of the virtual isolated pattern layer.

9. The method of claim 8, wherein the subset of design rules includes an internal spacing check, a width check, a vertex check, or a self-connect check.

10. The method of claim 1, further comprising:
    regenerating the virtual isolated pattern layer when an output of the design rule is outside a boundary of the pattern.

11. The method of claim 1, further comprising:
    applying the result of the determination to another identical shape within the semiconductor design, when the result is within a boundary of the pattern.

12. A system comprising:
    a memory storing instructions; and
    a processor, coupled with the memory and to execute the instructions, the instructions when executed cause the processor to:
    identify shapes within a semiconductor design, wherein the shapes correspond to patterns of layers of components of the semiconductor design;
    identify one or more patterns among the shapes;
    generate a virtual isolated pattern layer including data associated with the shapes and the one or more patterns;
    determine whether a pattern of the one or more patterns satisfies a design rule based on the data of the virtual isolated pattern layer; and
    verify the semiconductor design based on whether the pattern of the one or more patterns satisfies the design rule.

13. The system of claim 12, wherein the semiconductor design includes a plurality of hierarchical design levels and a plurality of cells and wherein the processor is further configured to:
    identify, for each cell instance of the semiconductor design, interactions between the cell and other structures in the plurality of hierarchical design levels; and
    identify the shapes as remaining shapes that are not included in the interactions.

14. The system of claim 13, wherein the interactions include parent to child interactions and sibling interactions.

15. The system of claim 12, wherein the processor is further configured to:
    store location information for the pattern and location information associated with instantiations of the pattern.

16. The system of claim 12, wherein the processor is further configured to:
    feed a result of a first design rule check to a second design rule check when the result of the first design rule check is within a boundary of the pattern.

17. The system of claim 12, wherein the processor is further configured to:
    identifying a subset of design rules of a runset based on a type of the design rule; and applying the subset of design rules using the data of the virtual isolated pattern layer.

18. The system of claim 17, wherein the subset of design rules includes an internal spacing check, a width check, a vertex check, or a self-connect check.

19. The system of claim 12, wherein the processor is further configured to:

regenerate the virtual isolated pattern layer when an output of the design rule is outside a boundary of the pattern.

20. A non-transitory computer readable medium comprising stored instructions, which when executed by a processor, cause the processor to:

identify shapes within a design, wherein the shapes correspond to patterns of layers of components of a semiconductor design;

identify one or more patterns among the shapes;

generate a virtual isolated pattern layer including data associated with the shapes and the one or more patterns;

determine whether a pattern of the one or more patterns satisfies a design rule based on the data of the virtual isolated pattern layer; and verify the semiconductor design based on whether the pattern of the one or more patterns satisfies the design rule.

* * * * *